US006992396B2

(12) United States Patent
Arai et al.

(10) Patent No.: US 6,992,396 B2
(45) Date of Patent: Jan. 31, 2006

(54) SEMICONDUCTOR DEVICE AND METHOD FOR FABRICATING THE SAME

(75) Inventors: Yoshiyuki Arai, Kyoto (JP); Takashi Yui, Shiga (JP); Yoshiaki Takeoka, Kyoto (JP); Fumito Itou, Osaka (JP); Yasutake Yaguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 99 days.

(21) Appl. No.: 10/649,741

(22) Filed: Aug. 28, 2003

(65) Prior Publication Data

US 2004/0126926 A1 Jul. 1, 2004

(30) Foreign Application Priority Data

Dec. 27, 2002 (JP) .............................. 2002-381135

(51) Int. Cl.
  *H01L 29/40* (2006.01)
(52) U.S. Cl. .................................................... 257/777
(58) Field of Classification Search ................ 257/183, 257/192, 213, 499–501, 503, 505, 506, 508, 257/524, 528, 678, 684–686, 690, 692, 693, 257/700–702, 729, 731, 737–738, 777–784, 257/787–789; 438/109, 108
See application file for complete search history.

(56) References Cited

U.S. PATENT DOCUMENTS 5,903,049 A * 5/1999 Mori .......................... 257/686
6,157,080 A * 12/2000 Tamaki et al. ............... 257/738
6,353,263 B1 * 3/2002 Dotta et al. .................. 257/777
6,452,279 B2 * 9/2002 Shimoda ...................... 257/777
6,514,794 B2 * 2/2003 Haba et al. .................. 438/109
6,657,290 B2 * 12/2003 Fukui et al. ................. 257/686
2002/0004258 A1 1/2002 Nakayama et al.
2005/0003580 A1 * 1/2005 Arai et al. .................... 438/109

FOREIGN PATENT DOCUMENTS

| JP | 11-204720 | 7/1999 |
| JP | 11-219984 | 8/1999 |
| JP | 2000-269407 A | 9/2000 |
| JP | 2002-026238 A | 1/2002 |
| JP | 2002-368190 A | 12/2002 |
| WO | WO 01/18864 A1 | 3/2001 |

* cited by examiner

Primary Examiner—Michael Lebentritt
Assistant Examiner—Andre' Stevenson
(74) Attorney, Agent, or Firm—McDermott Will & Emery LLP

(57) ABSTRACT

A semiconductor device has a substrate having electrode pads, a first semiconductor chip mounted on the substrate with a first adhesion layer interposed therebetween, a second semiconductor chip mounted on the first semiconductor chip with a second adhesion layer interposed therebetween and having electrode pads on the upper surface thereof, wires for bonding the electrode pads of the substrate and the electrode pads of the second semiconductor chip to each other, and a mold resin sealing therein the first and second semiconductor chips and the wires. The peripheral edge portion of the first adhesion layer is protruding outwardly from the first semiconductor chip and the peripheral edge portion of the second semiconductor chip is protruding outwardly beyond the peripheral edge portion of the first semiconductor chip.

6 Claims, 5 Drawing Sheets

SEMICONDUCTOR DEVICE AND METHOD FOR FABRICATING THE SAME

BACKGROUND OF THE INVENTION

The present invention relates to a semiconductor device composed of a plurality of stacked semiconductor chips and to a method for fabricating the same.

As an example of the semiconductor device composed of a plurality of stacked semiconductor chips, a structure has been known in which a plurality of semiconductor chips are mounted in stacked relation on a board termed an interposer or a substrate, which are sealed with a mold resin (see, e.g., page 7 and FIG. 3 of Japanese Laid-Open Patent Publication No. HEI 11-204720). This type of semiconductor device is also referred to as a stacked package. An object of forming the semiconductor device in such a multilayer-chip-type structure is to increase the mounting density of the semiconductor chips.

FIGS. 5A and 5B show a conventional multilayer-chip-type semiconductor device, of which FIG. 5A is a cross-sectional view and FIG. 5B is a plan view.

In FIGS. 5A and 5B, a first semiconductor chip 103 having bumps 103a are mounted with the bumps 103a facing downward on a substrate 101 having electrode pads 101a on the upper surface thereof and lands 101b on the lower surface thereof with a first adhesion layer 102 interposed therebetween. A second semiconductor chip 105 having electrodes pads 105a on the upper surface thereof is mounted on the first semiconductor chip 103 with a second adhesion layer 104 interposed therebetween. The electrodes pads 105a of the second semiconductor chip and the electrode pads 101a of the substrate 101 are electrically bonded to each other with wires 107. The first semiconductor chip 103, the second semiconductor chip 105, and the wires 107 are sealed with a mold resin 108, whereby the semiconductor device is formed.

The first adhesion layer 102 is composed of a film-like adhesive or a liquid adhesive which is filled in the entire region other than the bumps 103a between the substrate 101 and the first semiconductor chip 103 to firmly fix the first semiconductor chip 103 to the chip mounting region of the substrate 101. The arrangement disperses a stress over the entire chip mounting region of the substrate 101 and thereby increases the reliability of the semiconductor device.

In the conventional multilayer-chip-type semiconductor device, the peripheral edge portion of the first adhesion layer 102 is protruding outwardly from the peripheral edge portion of the first semiconductor chip 103, as shown in FIGS. 5A and 5B. This causes a first problem that, due to the protrusion (fillet) 102a, the size reduction of the semiconductor device is difficult. Since the wires 107 providing bonding between the electrode pads 105a of the second semiconductor chip 105 and the first electrode pads 101a of the substrate 101 should be disposed externally of the protrusion 102a of the first adhesion layer 102, i.e., since the electrode pads 101a of the substrate 101 should be disposed externally of the protrusion 102a of the first adhesion layer 102, the area of the substrate 101 is inevitably increased so that the size reduction of the semiconductor device is difficult.

The conventional multilayer-chip-type semiconductor device also has a second problem that the reliability thereof lowers due to the protrusion 102a of the first adhesion layer 102. Since the wires 107 should be disposed externally of the protrusion 102a of the first adhesion layer 102, as described above, the lengths of the wires 107 are increased disadvantageously. This causes a phenomenon in which the wires 107 are deformed by the mold resin 108 in sweeping motion in the step of injecting the mold resin 108 in a mold (the phenomenon is termed wire sweep or wire flow) so that such a defect as the breakage of the wire 107 or a short circuit between the adjacent wires 107 is more likely to occur. As the lengths of the wires 107 increase, the fluidity of the mold resin 108 is reduced so that, in some cases, an unfilled portion or a void occurs in the mold resin 108 to reduce the reliability of the semiconductor device 108. The second problem is conspicuously observed in a semiconductor device having the wires 107 at a high density.

SUMMARY OF THE INVENTION

It is therefore an object of the present invention to simultaneously solve the first and second problems and thereby provide a smaller-size multilayer-chip-type semiconductor device with higher reliability.

To attain the object, a semiconductor device according to the present invention comprises: a substrate having an electrode pad; a first semiconductor chip mounted on the substrate with a first adhesion layer interposed therebetween; a second semiconductor chip mounted on the first semiconductor chip with a second adhesion layer interposed therebetween and having an electrode pad on an upper surface thereof; a wire for bonding the electrode pad of the substrate and the electrode pad of the second semiconductor chip to each other; and a mold resin sealing therein the first and second semiconductor chips and the wire, the first adhesion layer having a peripheral edge portion protruding outwardly from the first semiconductor chip, the second semiconductor chip having a peripheral edge portion protruding outwardly beyond a peripheral edge portion of the first semiconductor chip.

In the semiconductor device according to the present invention, the peripheral edge portion of the second semiconductor chip is protruding outwardly beyond the peripheral edge portion of the first semiconductor chip. The arrangement prevents the situation in which the area of the substrate should be increased by the magnitude of the area occupied by the portion of the first adhesion layer protruding outwardly from the first semiconductor chip, which is observed in the conventional embodiments, so that a smaller-size multilayer-chip-type semiconductor device is implemented. The arrangement also prevents the situation in which the length of the wire should be increased by the length of the portion thereof located outside the protrusion of the first adhesion layer, which is also observed in the conventional embodiment. As a result, the influence of wire sweep occurring in the step of injecting a mold resin in a mold can be suppressed and a short circuit between wires can be prevented so that a semiconductor device with higher reliability is implemented.

In the semiconductor device according to the present invention, the peripheral edge portion of the second semiconductor chip is preferably protruding outwardly beyond the peripheral edge portion of the first adhesion layer.

In the arrangement, the peripheral edge portion of the first adhesion layer does not protrude outwardly beyond the peripheral edge portion of the second semiconductor chip so that a further-smaller-size semiconductor device with further higher reliability is implemented.

In the semiconductor device according to the present invention, a center of the second semiconductor chip is preferably offset from a center of the first semiconductor chip.

The arrangement allows proper adjustment the amount of outward protrusion of the peripheral edge portion of the second semiconductor chip from the peripheral edge portion of the first semiconductor chip in accordance with the amount of outward protrusion of the peripheral edge portion of the first adhesion layer from the first semiconductor chip.

In the semiconductor device according to the present invention, the center of the second semiconductor chip is preferably offset from the center of the first semiconductor chip in a direction of an edge of the peripheral edge portion of the first adhesion layer which is protruding most outwardly from the first semiconductor chip.

In the arrangement, the center of the second semiconductor chip is offset from the center of the first semiconductor chip in a direction of the edge of the peripheral edge portion of the first adhesion layer which is protruding most outwardly from the first semiconductor chip so that the portion of the first adhesion layer which is protruding most outwardly is located under the second semiconductor chip. This implements a smaller-size semiconductor device with higher reliability.

In the semiconductor device according to the present invention, the center of the second semiconductor chip is preferably offset from the center of the first semiconductor chip in a direction of an edge of the peripheral edge portion of the first adhesion layer which has a largest surface height from the substrate.

In the arrangement, the portion of the first adhesion layer which is protruding most outwardly is located under the second semiconductor chip so that a smaller-size semiconductor device with higher reliability is implemented.

In the semiconductor device according to the present invention, the center of the second semiconductor chip substantially preferably coincides with a center of the substrate.

The arrangement allows a stress balance in the semiconductor device to be closer to symmetry relative to the center of the substrate and also allows the lengths of the wires and the loop configurations thereof to be closer to uniformity at the four edge sides of the second semiconductor chip. As a result, operation stability in wire bonding is increased and a production yield is increased, while the time required for the operation is reduced.

A method for fabricating a semiconductor device according to the present invention comprises: a first step of disposing a first semiconductor chip on a substrate having an electrode pad; a second step of injecting an adhesive in a space between the substrate and the first semiconductor chip to form a first adhesion layer composed of the adhesive and having a peripheral edge portion protruding outwardly from the first semiconductor chip; a third step of mounting, on the first semiconductor chip, a second semiconductor chip having an electrode pad on a peripheral edge portion of an upper surface thereof with a second adhesion layer interposed therebetween; a fourth step of bonding the electrode pad of the substrate and the electrode pad of the second semiconductor chip to each other with a wire; and a fifth step of sealing the first and second semiconductor chips and the wire with a mold resin, the third step including the step of protruding a peripheral edge portion of the second semiconductor chip outwardly beyond a peripheral edge portion of the first semiconductor chip.

In the method for fabricating a semiconductor device according to the present invention, the peripheral edge portion of the second semiconductor chip is protruded outwardly beyond the peripheral edge portion of the first semiconductor chip. The arrangement prevents the situation in which the area of the substrate should be increased by the area occupied by the portion of the first adhesion layer which is protruding outwardly from the first semiconductor chip, which is observed in the conventional embodiments, so that a smaller-size multilayer-chip-type semiconductor device is implemented. The arrangement also prevents the situation in which the length of the wire should be increased by the length of the portion thereof located outside the protrusion of the first adhesion layer, which is also observed in the conventional embodiment. As a result, the influence of wire sweep occurring in the step of injecting a mold resin in a mold can be suppressed and a short circuit between wires can be prevented so that a semiconductor device with higher reliability is implemented.

In the method for fabricating a semiconductor device according to the present invention, the third step preferably includes the step of protruding the peripheral edge portion of the second semiconductor chip outwardly beyond the peripheral edge portion of the first adhesion layer.

In the arrangement, the peripheral edge portion of the first adhesion layer does not protrude outwardly beyond the peripheral edge portion of the second semiconductor chip so that a further-smaller-size semiconductor device with further higher reliability is implemented.

In the method for fabricating a semiconductor device according to the present invention, the first step preferably includes the step of disposing the first semiconductor chip such that a center of the first semiconductor chip is offset from a center of the substrate in a direction of an edge of the first semiconductor chip opposite to a direction of an edge thereof from which the adhesive is injected in the second step.

In the arrangement, the adhesive protrudes most outwardly from the first semiconductor chip along the edge from which the adhesive is injected so that the portion of the adhesive which is protruding most outwardly from the first semiconductor chip is located under the second semiconductor chip. This implements a smaller-size semiconductor device with higher reliability.

In the method for fabricating a semiconductor device according to the present invention, the third step preferably includes the step of mounting the second semiconductor chip such that a center of the second semiconductor chip is offset from a center of the first semiconductor chip.

The arrangement allows proper adjustment the amount of outward protrusion of the peripheral edge portion of the second semiconductor chip from the peripheral edge portion of the first semiconductor chip in accordance with the amount of outward protrusion of the peripheral edge portion of the first adhesion layer from the first semiconductor chip.

In the method for fabricating a semiconductor device according to the present invention, the third step preferably includes the step of mounting the second semiconductor chip such that the center of the second semiconductor chip is offset from the center of the first semiconductor chip in a direction of an edge of the first semiconductor chip from which the adhesive is injected in the second step.

In the arrangement, the adhesive protrudes most outwardly from the first semiconductor chip along the edge from which the adhesive is injected so that the portion of the adhesive which is protruding most outwardly from the first semiconductor chip is located under the second semiconductor chip. This implements a smaller-size semiconductor device with higher reliability.

In the method for fabricating a semiconductor device according to the present invention, the third step preferably includes the step of mounting the second semiconductor chip such that a center of the second semiconductor chip substantially coincides with a center of the substrate.

The arrangement allows a stress balance in the semiconductor device to be closer to symmetry relative to the center of the substrate and also allows the lengths of the wires and the loop configurations thereof to be closer to uniformity at the four edge sides of the second semiconductor chip. As a result, the stability of a wire bonding operation is increased and a production yield is increased, while the time required for the operation is reduced.

DETAILED DESCRIPTION OF THE INVENTION

Embodiment 1

A semiconductor device according to first embodiment of the present invention will be described herein below with reference to FIGS. 1A and 1B.

Figure 1A:
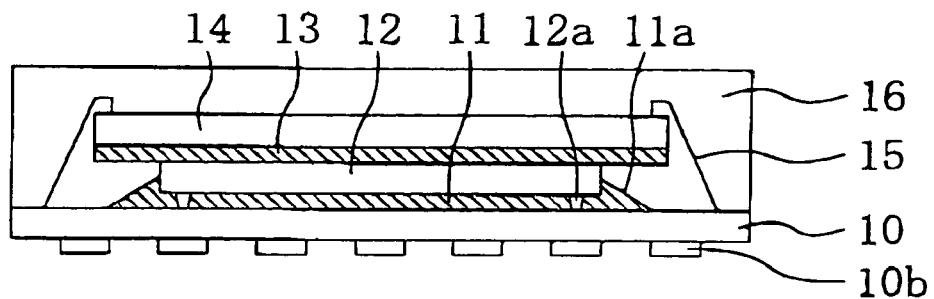
FIG. 1A is a cross-sectional view of a multilayer-chip-type semiconductor device according to a first embodiment of the present invention and FIG. 1B is a plan view of the multilayer-chip-type semiconductor device according to the first embodiment.
Figure 1B:
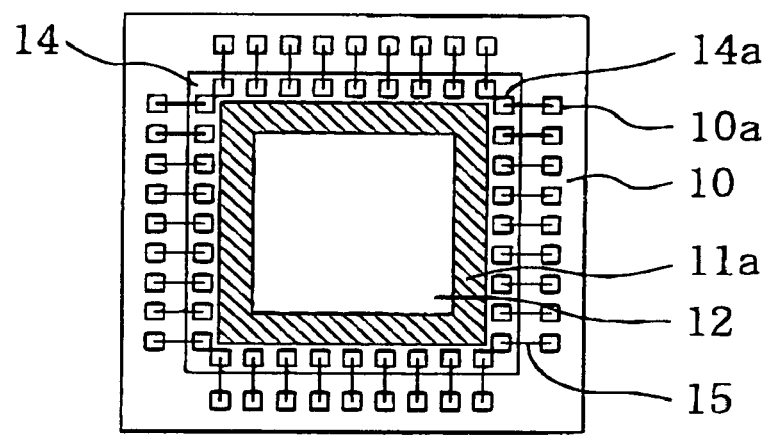

FIGS. 1A and 1B show a multilayer-chip-type semiconductor device according to the first embodiment, of which FIG. 1A is a cross-sectional view and FIG. 1B is a plan view.

In the present semiconductor device, as shown in FIGS. 1A and 1B, a square first semiconductor chip 12 having bumps 12a is mounted with the bumps 12a facing downward on a square substrate 10 having electrode pads 10a on the region of the upper surface thereof located outside a chip mounting region and lands 10b on the lower surface thereof with a first adhesion layer 11 interposed therebetween. A square second semiconductor chip 14 having electrode pads 14a along the peripheral edge portion of the upper surface thereof is mounted on the first semiconductor chip 12 with a second adhesion layer 13 interposed therebetween. The electrode pads 14a of the second semiconductor chip 14 and the electrode pads 10a of the substrate 10 are electrically bonded to each other with wires 15. The first semiconductor chip 12, the second semiconductor chip 14, and the wires 15 are sealed with a mold resin 16, whereby the semiconductor device is formed.

The substrate 10 is a sheet-like insulator internally provided with a conductor for providing electrical bonding between the electrode pads 10a and the lands 10b. The substrate 10 has the function of electrically interconnecting a mother board (not shown), on which the semiconductor device according to the first embodiment is mounted, with the first semiconductor chip 12 and the second semiconductor chip 14. As the insulator of the substrate 10, ceramic such as alumina, epoxy, BT resin, polyimide, or the like is used. As the internal conductor, copper, tungsten, or the like is used. The lands 10b are typically arranged in a grid-like configuration and used for the mounting of the semiconductor device to the mother board. Although FIG. 1A shows the semiconductor device of LGA (Land Grid Array) type using the lands 10b, a semiconductor device of BGA (Ball Grid Array) type using metal balls instead of the lands 10b may also be used instead.

The first adhesion layer 11 has the functions of firmly fixing the substrate 10 and the first semiconductor chip 12 to each other and maintaining the reliability of flip-chip bonding between the substrate 10 and the bumps 12a. As an adhesion composing the first adhesion layer 11, a thermosetting resin containing an epoxy resin or the like as a main component can be used primarily. It is possible to use an adhesive which is in a liquid state or in a film-like configuration before it is thermoset. Selection can be made depending on required characteristics or a formation method. As an example of the formation method using a liquid adhesive, there can be listed a method in which a liquid adhesive is supplied dropwise to the outside of the first semiconductor chip 12 mounted on the substrate 10. In accordance with the method, the liquid adhesive is filled by capillarity into the space between the substrate 10 and the first semiconductor chip 12 so that, if it is set in a setting furnace thereafter, the first adhesion layer 11 is formed. As an example of the formation method using a film-like adhesive, on the other hand, there can be listed a method in which a film-like adhesive is applied temporarily to the substrate 10 and then the first semiconductor chip 12 is thermally compression bonded onto the adhesive. Electrical bonding may also be provided between the substrate 10 and the bumps 12a by using an anisotropic conductive film, as the first adhesion layer 11, in which a conductive filler is dispersed and a plated bump as the bump 12a. Further, in the case where the first adhesion layer 11 is made of an insulating film, electrical bonding may be provided between the substrate 10 and the bumps 12a by piercing the film layer with the use of a stud bump or a printed bump as the bump 12a. In this case, the same formation method as described above is used in the case of using a film-like adhesive. In the case of using a liquid adhesive, however, a formation method different from the one described above is used, which coats a liquid adhesive onto the substrate 10, mounts the first semiconductor chip 12 on the adhesive, and then thermosetting the liquid adhesive. In some cases, a liquid adhesion may also be termed an underfill irrespective of the presence or absence of a conductive filler.

The second adhesion layer 13 has the function of fixing the first and second semiconductor chips 12 and 14 to each other. As an adhesive composing the second adhesion layer 13, a thermosetting resin containing an epoxy resin or the like as a main component may be used primarily in the same manner as in the first adhesion layer 11. It is also possible to use an adhesive which is in a liquid state or in a film-like configuration before it is thermoset. Selection can be made depending on required characteristics or a formation method. The second adhesion layer 13 shown in FIG. 1A shows the case where a filter-like adhesive is used. In a typical formation method using a film-like adhesive, the adhesive is applied to the back surfaces of the second semiconductor chips 14 in the form of a wafer. The film-like adhesive is cut into pieces of the same size as the individual second semiconductor chips 14 when they are separated from each other and each of the adhesive pieces is thermally compression bonded to the first semiconductor chip 12. In another formation method using a film-like adhesive, the film-like adhesive is wound into a roll and a portion thereof having a proper area is cut out of the roll by using a cutter, which is thermally compression bonded to the first semiconductor chip 12. Thereafter, the second semiconductor chip 14 is thermally compression bonded onto the adhesive. As an example of the formation method using a liquid adhesive, there can be listed a method in which the adhesive 5 is supplied dropwise onto the first semiconductor chip 12 at a room temperature. After the second semiconductor chip 14 is mounted on the adhesive, the resulting structure is placed in a setting furnace such that the liquid adhesive is thermoset.

Although a wafer made of Si is used normally for the first and second semiconductor chips 12 and 14, it is also possible to use a wafer made of a compound semiconductor such as SiGe, GaAs, or GaP instead. The first and second semiconductor chips 12 and 14 may be made of the same material or different materials.

The bumps 12a are made of Ag, Au, Cu, a solder, or the like. As an example of a method for forming the bumps 12a, there can be listed printing, mask vapor deposition, stud bump formation, plating, bump transfer, or the like. As an example of the method for bonding the bumps 12a to the substrate 10, there can be listed a method which melts solder bumps for bonding, a method which adds a conductive paste to the bumps 12a for bonding, a method which compression bonds the bumps 12a through the set shrinkage of the first adhesion layer 11, a method which bonds the bumps 12a by using an ultrasonic wave. Selection can be made appropriately depending on the material of the bumps 12a.

The wires 15 are typically made of Au, Al, or the like and has the function of providing electrical bonding between the electrode pads 14a of the second semiconductor chip 14 and the electrode pads 10a of the substrate 10. As a bonding method using the wires 15, thermosonic bonding is used primarily.

The mold resin 16 is typically composed of an epoxy resin. Depending on a molding method, an epoxy resin which is in a solid or liquid state before setting can be used selectively. As a formation method for the mold resin 16, a transfer method can be listed in the case of using a solid resin and a potting or printing method can be listed in the case of using a liquid resin. In the transfer method, a resin formed as a tablet is melt in a mold, injected under pressure into an inner space of the mold in which objects to be sealed are held, and then set in a setting furnace, so that the mold resin 16 is formed. In the potting method, a resin is coated on objects to be sealed and then set in a set furnace, so that the mold resin 16 is formed. In the printing method, a screen mask is brought into close contact with objects to be sealed and a mold resin is transferred into an opening in the screen mask by using a printing squeezer. After the screen mask is removed, the mold resin is set in a setting furnace, so that the mold resin 16 is formed. It is effective in preventing voids to perform the process according to the printing method partly in a vacuum chamber. In the mold resin 16, a silica filler is normally mixed in a proportion of 60 wt % to 80 wt %.

In the multilayer-chip-type semiconductor device according to the first embodiment, the peripheral edge portion of the first adhesion layer 11 is protruding outwardly beyond the peripheral edge portion of the first semiconductor chip 12, while the peripheral edge portion of the second semiconductor chip 14 is protruding more outwardly than the protrusion 11a, as shown in FIG. 1A. Briefly, the peripheral edge portion of the first adhesion layer 11 is not protruding outwardly beyond the peripheral edge portion of the second semiconductor chip 14. This prevents the situation in which the area of the substrate 10 should be increased by the magnitude of the area occupied by the protrusion 11a of the first adhesion layer 11, which is observed in the conventional embodiments, so that a smaller-size multilayer-chip-type semiconductor device is implemented.

In addition, the peripheral edge portion of the first adhesion layer 11 is not protruding outwardly beyond the peripheral edge portion of the second semiconductor chip 14. This prevents the situation in which the lengths of the wires 15 should be increased by the lengths of the portions thereof located outside the protrusion 11a of the first adhesion layer 11, which is also observed in the conventional embodiments. As a result, the influence of wire sweep occurring in the step of injecting a resin before setting, which will form the mold resin 16, can be suppressed and a short circuit between the wires can be prevented so that a semiconductor device with higher reliability is implemented.

A description will be given next by using a specific example. If the first adhesion layer 11 is made of, e.g., an adhesive composed of a film-like resin, the distance between the peripheral edge portion of the first semiconductor chip 11 and the peripheral edge portion of the protrusion 11a of the first semiconductor chip 11 as the length of the protrusion 11a is about 1 mm at the maximum. If the peripheral edge portion of the second semiconductor chip 14 is assumed to be protruding outwardly beyond the peripheral edge portion of the first semiconductor chip 12 by about 2 mm in each of vertical and horizontal directions, the protrusion 11a of the first adhesion layer 11 does not protrude beyond the peripheral edge portion of the second semiconductor chip 14.

Consideration will be given to the case where the first and second semiconductor chips 12 and 14 are mounted by switching the respective vertical positions thereof shown in FIG. 1A, i.e., to the case (not shown) where the second semiconductor chip 14 is mounted on the substrate 10 with the first adhesion layer 11 interposed therebetween, the first semiconductor chip 12 is mounted on the second semiconductor chip 14 with the second adhesion layer 13 interposed therebetween, and the first semiconductor chip 12 and the substrate 10 are bonded to each other with the wires 15 via the electrode pads. As described above, it is assumed that the length of the second semiconductor chip 14 is larger by about 2 mm than the length of the first semiconductor chip 12 and the length of the protrusion 11a of the first adhesion layer 11 is about 1 mm at the maximum. In this case, it is necessary to provide the substrate 10 with an extra area corresponding to the maximum length (about 1 mm×2) of the protrusion 11a. In the semiconductor device shown in FIG. 1A, by contrast, the area of the substrate 10 need not be increased as stated previously. Compared with the case where the first and second semiconductor chips 12 and 14 are mounted by switching the respective vertical positions thereof, the size of the substrate 10 need not be increased any more by about 2 mm in each of vertical and horizontal directions so that a smaller-size semiconductor device is implemented. Since each of the wires 15 should be extended from the first semiconductor chip 12, which is smaller by 2 mm than the second semiconductor chip 14, to a point external of the protrusion 11a of the first adhesion layer 11, it is necessary to elongate the wire by about 2 mm compared with the case of the multilayer-chip-type semiconductor device shown in FIG. 1A. Accordingly, the lengths of the wires 15 can be reduced in the semiconductor device shown in FIG. 1A, compared with the case where the first and second semiconductor chips 12 and 14 are mounted by switching the respective vertical positions thereof, so that a semiconductor device with higher reliability is implemented.

The foregoing description has been given to the case where the peripheral edge portion of the second semiconductor chip 14 is protruding outwardly beyond the peripheral edge portion of the protrusion 11a of the first adhesion layer 11, as shown in FIG. 1A. This is because the area of the substrate 10 and the lengths of the wires 15 can be minimized in this case and hence it is most preferable as an embodiment. However, the present embodiment is not limited thereto. For example, a smaller-size multilayer-chip-type semiconductor device with higher reliability can be implemented provided that the peripheral edge portion of the second semiconductor chip 14 is protruding even slightly outwardly beyond the peripheral edge portion of the first semiconductor chip 12. This is because, so long as the peripheral edge portion of the protrusion 11a of the first adhesion layer 11 is protruding outwardly beyond the peripheral edge portion of the second semiconductor chip 14 even slightly, the area of the substrate 10 can be reduced by the area occupied by the portion of the protrusion 11a located under the peripheral edge portion of the second semiconductor chip 14 so that a smaller-size multilayer-chip-type semiconductor device with higher reliability is implemented.

As shown in FIG. 1B, the present embodiment has described the case where the plan configuration of each of the first and second semiconductor chips 12 and 14 is a rectangle. Even if the plan configuration of each of the first and second semiconductor chips 12 and 14 is a rectangle, however, at least a part of the protrusion 11a of the first adhesion layer 11 is located under the second semiconductor chip 14 provided that the peripheral edge portion of the second semiconductor chip 14 is protruding outwardly beyond the peripheral edge portion of the first semiconductor chip 12. As a result, a smaller-size semiconductor device with higher reliability is implemented. It is not necessary for each of the four sides on the periphery of the second semiconductor chip 14 to protrude outwardly from the corresponding one of the four sides on the periphery of the first semiconductor chip 12. If the second semiconductor chip 14 is mounted to have a peripheral edge portion protruding outwardly beyond the peripheral edge portion of the first semiconductor chip 12 such that at least a part of the peripheral edge portion of the protrusion 11a of the first adhesion layer 11, which is protruding most outwardly from the first semiconductor chip 12, is located under the second semiconductor chip 14, a smaller-size semiconductor device with higher reliability can be implemented.

Embodiment 2

A semiconductor device according to a second embodiment of the present invention will be described with reference to FIGS. 2A and 2B.

Figure 2A:
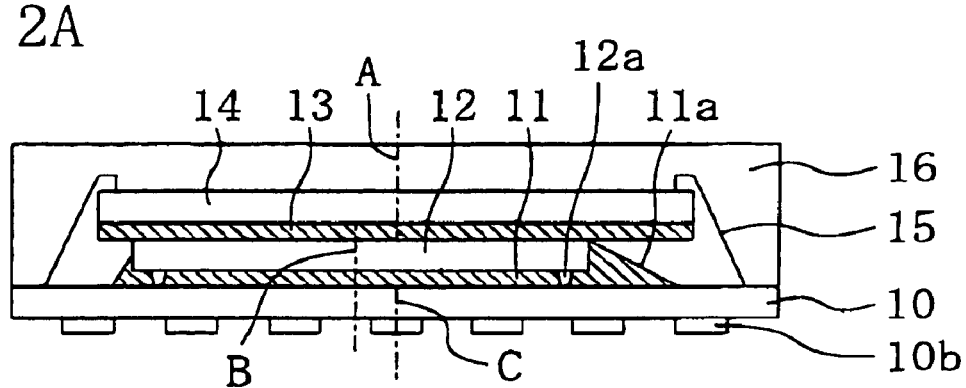
FIG. 2A is a cross-sectional view of a multilayer-chip-type semiconductor device according to a second embodiment of the present invention and FIG. 2B is a plan view of the multilayer-chip-type semiconductor device according to the second embodiment.
Figure 2B:
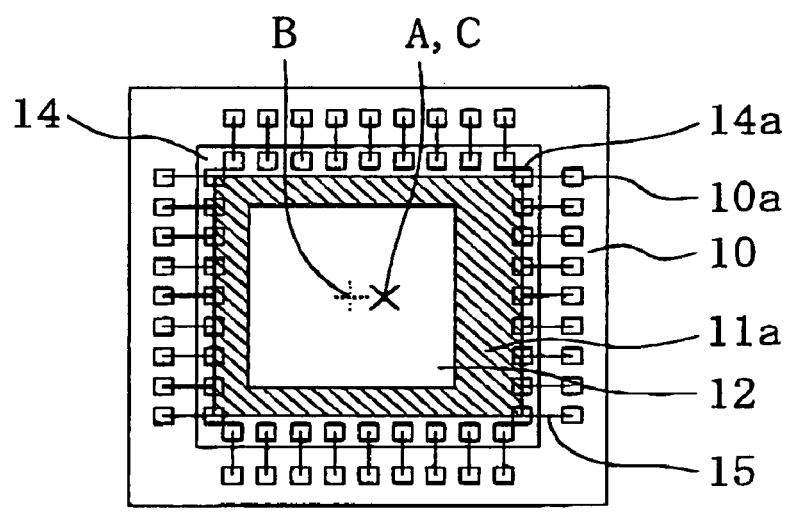

FIGS. 2A and 2B are views for illustrating the semiconductor device according to the second embodiment, of which FIG. 2A is a cross-sectional view and FIG. 2B is a plan view.

In FIGS. 2A and 2B, the center axis A of the second semiconductor chip 14, the center axis B of the first semiconductor chip 12, and the center axis C of the substrate 10 are shown.

In the present semiconductor device, a square first semiconductor chip 12 having bumps 12a is mounted with the bumps 12a facing downward on a square substrate 10 having electrode pads 1a on the upper surface thereof and having lands 10b on the lower surface thereof with a first adhesion layer 11 interposed therebetween, as shown in FIGS. 2A and 2B. A square second semiconductor chip 14 having electrode pads 14a on the peripheral edge portion of the upper surface thereof is mounted on the first semiconductor chip 12 with a second adhesion layer 13 interposed therebetween. The electrode pads 14a of the second semiconductor chip 14 and the electrode pads 1a of the substrate 10 are electrically bonded to each other with wires 15. The first and second semiconductor chips 12 and 14 and the wires 15 are sealed with a mold resin 16, whereby the semiconductor device is formed.

As shown in FIGS. 2A and 2B, the present embodiment has mounted the second semiconductor chip 14 on the first semiconductor chip 12 with the second adhesion layer 13 interposed therebetween such that the center axis A of the second semiconductor chip 14 coincides with the center axis C of the substrate 10. The present embodiment has also mounted the first semiconductor chip 12 on the substrate 10 with the first adhesion layer 11 interposed therebetween while offsetting the center axis B of the first semiconductor chip 12 from the center axis A of the second semiconductor chip 14 and from the center axis C of the substrate 10 such that the first semiconductor chip 12 is not coaxial with the second semiconductor chip 14 and with the substrate 10. The direction in which the center axis B of the first semiconductor chip 12 is offset when it is mounted is opposite to the direction of the edge of the protrusion 11a of the first adhesion layer 11 which is protruding most outwardly from the first semiconductor chip 12. In other words, the center axis A of the second semiconductor chip 14 is offset from the center axis B of the first semiconductor chip 12 in the direction of that one of the edges of the protrusion 11a of the first adhesion layer 11 which is protruding most outwardly from the first semiconductor chip 12.

Even if the peripheral edge portion of the protrusion 11a of the first adhesion layer 11 is protruding outwardly from the first semiconductor chip 12 and an amount of protrusion is non-uniform along the edges of the first adhesion layer 11, the second semiconductor chip can have the peripheral edge portion thereof protruding outwardly beyond the peripheral edge portion of the first adhesion layer 11 by mounting the first semiconductor chip 12 such that the center axis B thereof is offset from the center axis A of the second semiconductor chip 14 and from the center axis C of the substrate 10. This prevents the situation in which the area of the substrate 10 should be increased by the area occupied by the protrusion 11a of the first adhesion layer 11, which has been observed conventionally, so that a smaller-size multilayer-chip-type semiconductor device is implemented. This also prevents the situation in which the lengths of the wires 15 should be increased by the lengths of the portions of the wires 15 located outside the protrusion 11a of the first adhesion layer 11. As a result, the influence of wire sweep occurring in the step of injecting the mold resin 16 in a mold can be suppressed and a short circuit between the wires can be prevented so that the reliability of the semiconductor device is increased.

A description will be given next to advantages obtained by coinciding the center axis A of the second semiconductor chip 14 with the center axis C of the substrate 10.

The first advantage is that a stress balance in the semiconductor device can be brought closer to symmetry relative to each of the center axes A and C by coinciding the center axis A of the second semiconductor chip 14, which is a largest structure in the mold resin 16, with the center axis C of the substrate 10 in the multilayer-chip-type semiconductor device. This reduces the localization of stresses occurring when the distribution of stresses in the semiconductor device is uneven during, e.g., reflow mounting and prevents the degradation of the semiconductor device.

The second advantage is that the lengths of the wires 15 and the loop configurations thereof can be brought closer to uniformity along the four edge sides of the second semiconductor chip 14. This increases operation stability in the wire bonding step compared with the case where the respective lengths of the wires 15 are not uniform, increases a yield rate, and reduces the time required for the step. It is also possible to achieve the same effect as achieved by the second advantage by designing a wiring pattern for the substrate 10 such that the lengths of the wires 15 are uniform without coinciding the center axis A with the center axis C.

Although the description has been given thus far to the case where the center axis A is made coincident with the center axis C, it will easily be appreciated that the same effect is achievable by positioning the center axes A and C such that they are nearly coincident.

It is also possible to dispose the first and second semiconductor chips 12 and 14 on the substrate 10 such that the center axis B of the first semiconductor chip 12 is coincident with the center axis C of the substrate 10 and that the center axis A of the second semiconductor chip 14 is offset from the center axis B of the first semiconductor chip 12 and from the center axis C of the substrate 10 or dispose the first and second semiconductor chips 12 and 14 on the substrate 10 such that the respective center axes A, B, and C are offset from each other and are not coincident. In either of the cases, if the peripheral edge of the second semiconductor chip 14 has a portion protruding beyond the peripheral edge portion of the first semiconductor chip 12, the semiconductor device can be reduced in size by the area of the portion of the protrusion 11a of the first adhesion layer 11 located under the protruding portion. The directions in which the center axes A and B of the second and first semiconductor chips 14 and 12 are offset from the center axis C of the substrate 10 and the amounts of offsetting in these cases may be determined appropriately by examining the respective configurations and areas of the first and second semiconductor chips 12 and 14, the substrate 10, and the protrusion 11a of the first adhesion layer 11, the lengths of the wires 15, and the like such that optimum design which enables maximum miniaturization of the semiconductor device is performed.

Embodiment 3

A semiconductor device according to a third embodiment of the present invention will be described with reference to FIGS. 3A to 3E.

FIGS. 3A to 3E are cross-sectional views illustrating, in the order of progression, the individual steps of a method for fabricating the semiconductor device according to the third embodiment.

Figure 3A:
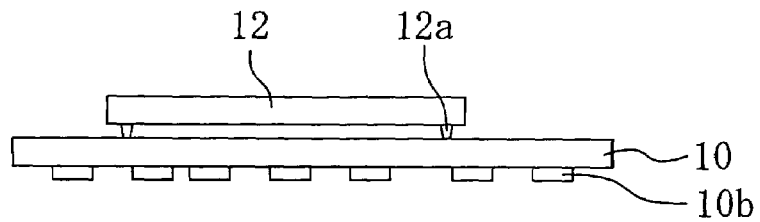
FIGS. 3A to 3E are cross-sectional views illustrating, in the order of progression, the individual process steps of a method for fabricating a multilayer-chip-type semiconductor device according to a third embodiment of the present invention.

FIG. 3A is a view showing the first step. In the present step termed a flip chip bonding step, a first semiconductor chip 12 is disposed on a substrate 10 having electrode pads (not shown). In this step, positioning is performed such that bumps 12a provided on the first semiconductor chip 12 are connected to the electrode pads (not shown) of the substrate 10 and the first semiconductor chip 12 is mounted such that the bumps 12a face downward. It is also possible to connect the bumps 12a to the electrode pads of the substrate 10 by adding a conductive paste to the bumps 12a. If the first semiconductor chip 12 is mounted on the substrate 10 such that the center axis B of the first semiconductor chip 12 is offset from the center axis C of the substrate 10 in a direction of the edge opposite to the edge from which an adhesive is injected, a portion for reserving the adhesive (hereinafter referred to as a reserving portion) formed in injecting the adhesive can be formed to occupy a large space.

Figure 3B:
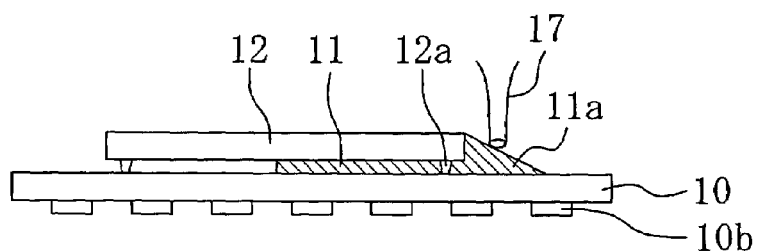

FIG. 3B is a view showing the second step. In the present step termed an underfill step, an adhesive is injected into the space between the substrate 10 and the first semiconductor chip 12 to form a first adhesion layer 11 composed of the adhesive and having a peripheral edge portion protruding outwardly from the first semiconductor chip 12. In the case of injecting a liquid adhesive into the space between the first semiconductor chip 12 and the substrate 10, a nozzle 17 is positioned on the outer edge of the first semiconductor chip 12 to eject the adhesive. If necessary, the nozzle 17 is moved reciprocally along the edge side from which the adhesive is injected to eject the adhesive so that the portion for reserving a required amount of the adhesive to be injected is formed. The adhesive is filled from the reserving portion by the surface tension of the adhesive into the space between the first semiconductor chip 12 and the substrate 10. When the filling of the adhesive is completed, the injected adhesive is set so that the first adhesion layer 11 is formed.

A specific description will be given to the protrusion 11a of the first adhesion layer 11. If consideration is given to the case where, e.g., the adhesive is injected from one of the edge sides of the first semiconductor chip 12, the reserving portion is formed around the one edge side so that the protruding length and height of the protrusion 11a of the adhesive are larger along the edge side than along the other three edge sides. Although fillets are formed naturally along the other three edge sides, the protruding lengths and heights thereof are not as large as those of the protrusion 11a from the edge side formed with the reserving portion. Specifically, the protruding length of the protrusion 11a is about 2 mm at the maximum along the edge side formed with the reserving portion, while it is about 0.5 mm along the other three edge sides. Thus, the peripheral edge portion of the protrusion 11a of the adhesive is larger in protruding length and height along one of the four edge sides than along the other three edge sides.

The configuration of the protrusion 11a of the first adhesion layer 11 can be controlled by optimizing a condition such as the material of the adhesive to be used, an amount of injection, an injection time, or a setting temperature. In this case, a smaller-size semiconductor device can be implemented by controlling the configuration of the protrusion 11a such that the protrusion 11a does not protrude beyond the peripheral edge portion of the second semiconductor chip 14 to be mounted in a step which will be described later.

Figure 3C:
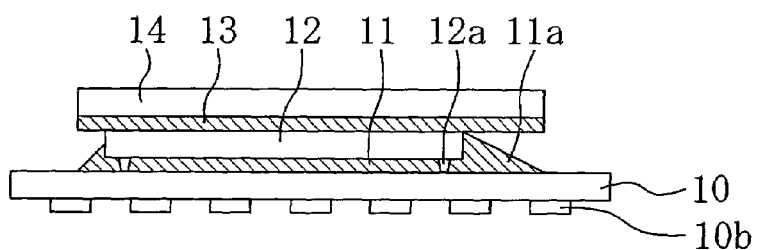

FIG. 3C is a view showing the third step. In the present step termed a stacked die bonding step, the second semiconductor chip 14 having electrode pads along the peripheral edge portion of the upper surface thereof is mounted on the first semiconductor chip 12 with the second adhesion layer 13 interposed therebetween. At this time, the second semiconductor chip 14 is mounted on the first semiconductor chip 12 with the second adhesion layer 13 interposed therebetween such that the portion of the peripheral edge of the protrusion 11a of the adhesive which is protruding most outwardly from the first semiconductor chip 12 does not protrude beyond the peripheral edge portion of the second semiconductor chip 14 so that a smaller-size semiconductor chip is implemented. If consideration is given to the fact that the protruding length from the first semiconductor chip 12 along the edge side formed with the reserving portion is about 2 mm at the maximum, the position at which the second semiconductor chip 14 is mounted when the second semiconductor chip 14 is larger by 1 mm than the first semiconductor chip 12 in each of vertical and horizontal directions is shifted by 1 mm from the center axis B of the first semiconductor chip 12 in the direction of the position at which the reserving portion is formed. Consequently, the peripheral edge portion of the second semiconductor chip 14 protrudes by 2 mm from the peripheral edge portion of the first semiconductor chip 12 so that the most outwardly extending portion of the protrusion 11a does not protrude beyond the peripheral edge of the second semiconductor chip 14.

This prevents the situation in which the area of the substrate 10 should be increased by the area occupied by the protrusion 11a of the first adhesion layer 11, which is observed in the conventional embodiments, so that a smaller-size multilayer-chip-type semiconductor device is implemented. Since the peripheral edge portion of the first adhesion layer 11 is not protruding from the peripheral edge portion of the second semiconductor chip 14, the situation in which the lengths of wires 15 should be increased, which is also observed in the conventional embodiment, is prevented. As a result, the influence of wire sweep occurring in the step of injecting a mold resin 16 in a mold, which will be described later, can be suppressed and a short circuit between the wires can be prevented so that a semiconductor device with higher reliability is increased.

Although the adhesive composing the second adhesion layer 13 between the first and second semiconductor chips 12 and 14 is shown in the state in which it has been adhered preliminarily to the back surface of the second semiconductor chip 14 in FIG. 3C, the type of the adhesive and a formation method using the adhesive may be those used in the first embodiment.

Figure 3D:
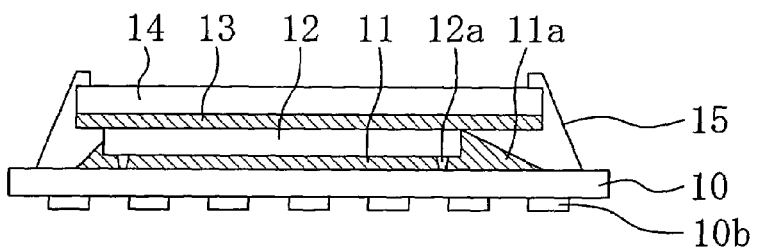

FIG. 3D is a view showing the fourth step. In the present step termed a wire bonding step, the electrode pads of the substrate 10 and the electrode pads of the second semiconductor chip 14 are bonded to each other with the wires 15. As also described in the first and second embodiments, if a structure is designed such that the lengths of the wires 15 are uniform around the entire circumference of the second semiconductor chip 14, exactly the same equipment conditions can be used for wiring so that a wiring operation is performed stably, the yield rate is increased, and the time required for the step is reduced.

Figure 3E:
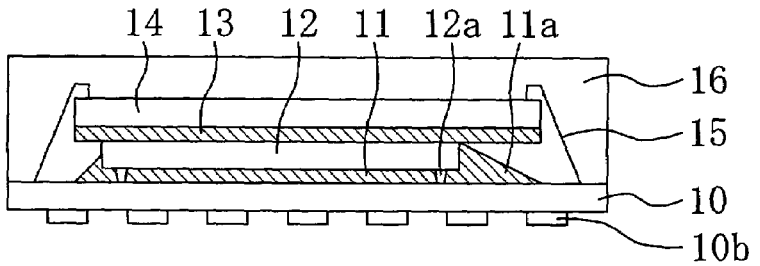

FIG. 3E is a view showing the fifth final step. In the present step termed a sealing step, the mold resin 16 sealing therein the first and second semiconductor chips 12 and 14 and the wires 15 is formed. By completely setting the mold resin 16, the semiconductor device is completed.

The foregoing description has been given to the case where a liquid resin is used as the adhesive composing the first adhesion layer 11. This is because, if a liquid adhesive is used, an increase in the amount of outward protrusion of the adhesive is observed remarkably along a specified edge side of the first semiconductor chip 12. Even if the first adhesion layer 11 is composed of a film-like adhesive, however, there is a case where the amount of outward protrusion is larger along the specified edge side, which is mainly the case where the positions and number of the bumps 12a of the first semiconductor chip 12 are non-uniform along the four edge sides of the first semiconductor chip 12. In this case also, a smaller-size semiconductor device with higher reliability can be implemented by off-setting, to a proper position, the center axis A of the second semiconductor chip 14 mounted on the first semiconductor chip 12 from the center axis B of the first semiconductor chip 12.

Although the description has been given to the case where the amount of outward protrusion of outward the first adhesion layer 11 is largest along that one of the edges of the first semiconductor chip 12 which serves as an injection hole for the adhesive composing the first adhesion layer 11, the amount of outward protrusion of the first adhesive layer 11 may also be larger along, e.g., two of the four edges of the first semiconductor chip 12. This is because a smaller-size semiconductor device with higher reliability can be implemented in either case by mounting the second semiconductor chip 14 on the first semiconductor chip 12 such that, if the amounts of protrusion along the two edges are the same, the protrusion 11a of the first adhesion layer 11 from either one of the two edges does not protrude outwardly beyond the peripheral edge portion of the second semiconductor chip 14 and, if the amount of outward protrusion is larger along either one of the two edges, the protrusion 11a of the first adhesion layer 11 from the edge with a larger amount of outward protrusion does not protrude outwardly beyond the peripheral edge portion of the second semiconductor chip 14.

Although the description has been given to the case where the plan configuration of each of the first and second semiconductor chips 12 and 14 is a square with reference to FIGS. 3A to 3E, even if the plan configuration is a rectangle, a smaller-size semiconductor device with higher reliability can be implemented by mounting the second semiconductor chip 14 on the first semiconductor chip 12 such that the peripheral edge portion of the second semiconductor chip 14 protrudes beyond the peripheral edge portion of the first semiconductor chip 12. It is not necessary for each of the four edge sides of the second semiconductor chip 14 to protrude beyond the peripheral edge portion of the first semiconductor chip 12. A smaller-size semiconductor device with higher reliability can be implemented by mounting the second semiconductor chip 14 on the first semiconductor chip 12 such that the portion of the peripheral edge of the protrusion 11a of the first adhesion layer 11, which is most outwardly protruding along one of the four side edges of the first semiconductor chip 12, does not protrude beyond the corresponding one of the edge sides of the second semiconductor chip 14.

Embodiment 4

A semiconductor device according to a fourth embodiment of the present invention will be described with reference to FIG. 4.

Figure 4:
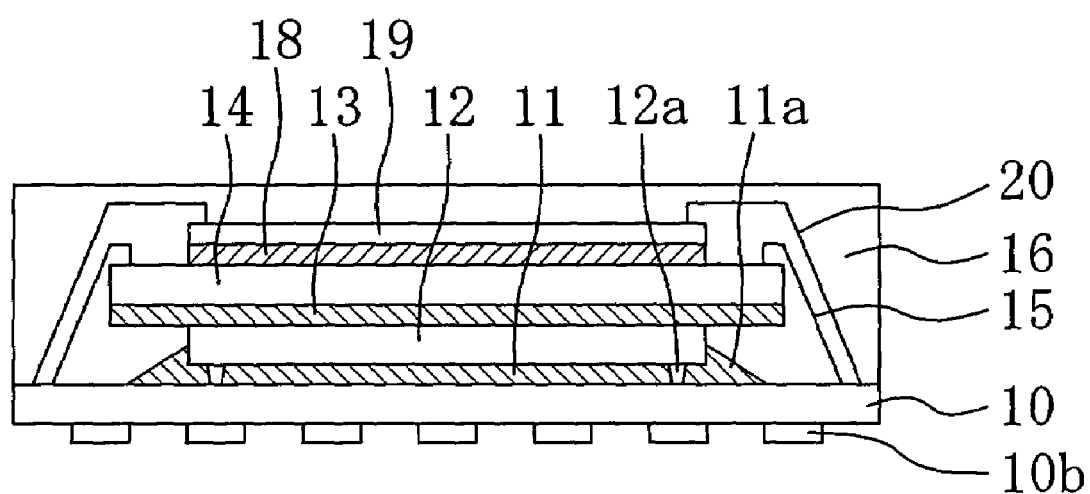
FIG. 4 is a cross-sectional view of the multilayer-chip-type semiconductor device according to the fourth embodiment.
Figure 5A:
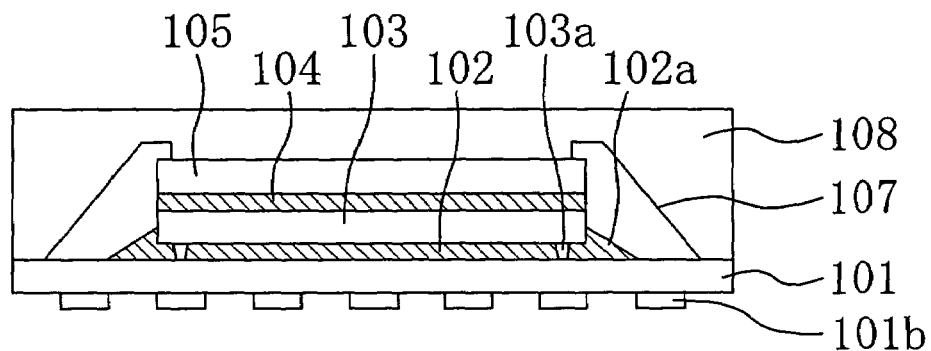
FIG. 5A is a cross-sectional view of a conventional multilayer-chip-type semiconductor device and FIG. 5B is a plan view of the conventional multilayer-chip-type semiconductor device.
Figure 5B:
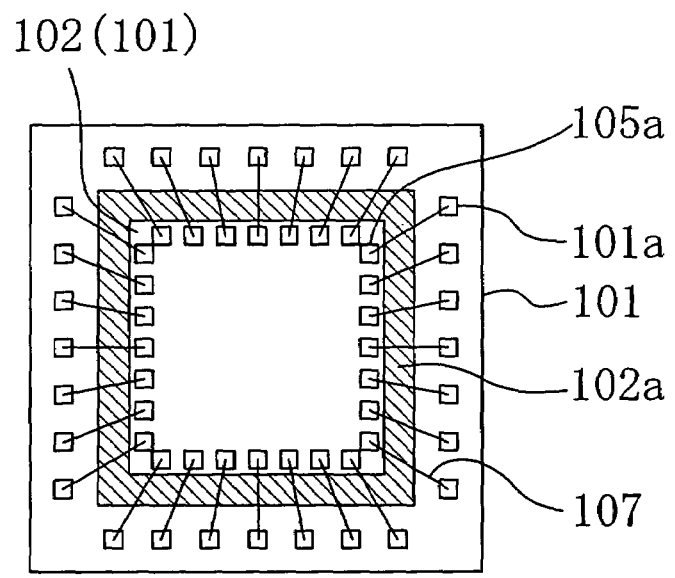

FIG. 4 is a view showing a multilayer-chip-type semiconductor device according to the fourth embodiment.

In the present semiconductor device, a square first semiconductor chip 12 having bumps 12a is mounted with the bumps 12a facing downward on a square substrate 10 having electrode pads on the upper surface thereof and lands 10b on the lower surface thereof with a first adhesion layer 11 interposed therebetween. A square second semiconductor chip 14 having electrode pads 14a along the peripheral edge of the upper surface thereof is mounted on the first semiconductor chip 12 with a second adhesion layer 13 interposed therebetween. The electrode pads 14a of the second semiconductor chip 14 and the electrode pads of the substrate 10 are electrically bonded to each other with wires 15. A square third semiconductor chip 19 having electrode pads along the peripheral edge portion of the upper surface thereof is mounted on the second semiconductor chip 14 with a third adhesion layer 18 interposed therebetween. The electrode pads of the third semiconductor chip 19 and the electrode pads of the substrate 10 are electrically bonded to each other with wires 20. The first, second, and third semiconductor chips 12, 14, and 19 and the wires 15 and 20 are sealed with a mold resin 16, whereby the semiconductor device having the semiconductor chips stacked in three layers is formed.

In the semiconductor device having the semiconductor chips stacked in three layers also, the multilayer-chip-type semiconductor device can be reduced in size and the reliability thereof can be increased by disposing the second semiconductor chip 14 on the first semiconductor chip 12 in consideration of the protruding length and height of the protrusion 11a of the first adhesion layer 11 such that the peripheral edge portion of the second semiconductor chip 14 is protruding outwardly at least beyond the peripheral edge portion of the first semiconductor chip 12.

Even in the case where the third and second semiconductor chips 19 and 14 are bonded to each other by using wires or even in the case where the third semiconductor chip 19 is mounted with the circuit formation surface thereof opposing the circuit formation surface of the second semiconductor chip 14 and flip chip bonding is provided therebetween by using the bumps, a smaller-size multilayer-chip-type semiconductor device with higher reliability can also be implemented.

In the semiconductor device having the three-level multilayer structure shown in FIG. 4 also, the second and third semiconductor chips 14 and 19 are disposed preferably on the first and third semiconductor chips 12 and 14 such that the respective center axes of the second and third semiconductor chips 14 and 19 are in superimposed relation with the center axis of the substrate 10 in the same manner as in the first and second embodiments.

What is claimed is:

1. A semiconductor device comprising:
a substrate having an electrode pad;
a first semiconductor chip mounted on the substrate with a first adhesion layer interposed therebetween;
a second semiconductor chip mounted on the first semiconductor chip with a second adhesion layer interposed therebetween and having an electrode pad on an upper surface thereof;
a wire for bonding the electrode pad of the substrate and the electrode pad of the second semiconductor chip to each other; and
a mold resin sealing therein the first and second semiconductor chips and the wire,
the first adhesion layer having a peripheral edge portion protruding outwardly from the first semiconductor chip,
the second semiconductor chip having a peripheral edge portion protruding outwardly beyond the outermost part of the peripheral edge portion of the first adhesion layer.

2. A semiconductor device comprising:
a substrate having an electrode pad;
a first semiconductor chip mounted on the substrate with a first adhesion layer interposed therebetween;
a second semiconductor chip mounted on the first semiconductor chip with a second adhesion layer interposed therebetween and having an electrode pad on an upper surface thereof;
a wire for bonding the electrode pad of the substrate and the electrode pad of the second semiconductor chip to each other; and
a mold resin sealing therein the first and second semiconductor chips and the wire,
the first adhesion layer having a peripheral edge portion protruding outwardly from the first semiconductor chip,
the second semiconductor chip having a peripheral edge portion protruding outwardly beyond the peripheral edge portion of the first adhesion layer,
wherein a center of the second semiconductor chip is offset from a center of the first semiconductor chip.

3. The semiconductor device of claim 2, wherein the center of the second semiconductor chip is offset from the center of the first semiconductor chip in a direction of an edge of the peripheral edge portion of the first adhesion layer which is protruding most outwardly from the first semiconductor chip.

4. The semiconductor device of claim 2, wherein the center of the second semiconductor chip is offset from the center of the first semiconductor chip in a direction of an edge of the peripheral edge portion of the first adhesion layer which has a largest surface height from the substrate.

5. The semiconductor device of claim 2, wherein the center of the second semiconductor chip substantially coincides with a center of the substrate.

6. The semiconductor device of claim 1, wherein the second adhesion layer has a film-like configuration.

* * * * *

UNITED STATES PATENT AND TRADEMARK OFFICE
CERTIFICATE OF CORRECTION

PATENT NO.       : 6,992,396 B2
APPLICATION NO.  : 10/649741
DATED            : January 31, 2006
INVENTOR(S)      : Yoshiyuki Arai et al.

It is certified that error appears in the above-identified patent and that said Letters Patent is hereby corrected as shown below:

<u>Title page,</u>
Item [56], References Cited, FOREIGN PATENT DOCUMENTS, change "JP 2002-026238" to -- JP 2002-026236 --.

Signed and Sealed this

Twenty-seventh Day of June, 2006

JON W. DUDAS
*Director of the United States Patent and Trademark Office*